United States Patent
Choi et al.

(10) Patent No.: US 8,378,698 B2
(45) Date of Patent: Feb. 19, 2013

(54) INTEGRATED CIRCUIT TESTING APPARATUS AND METHOD

(75) Inventors: Jae-Young Choi, Hwaseong-si (KR); Chang-Hyun Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 392 days.

(21) Appl. No.: 12/798,605

(22) Filed: Apr. 7, 2010

(65) Prior Publication Data

US 2011/0128022 A1    Jun. 2, 2011

(30) Foreign Application Priority Data

Dec. 2, 2009  (KR) .................. 10-2009-0118566

(51) Int. Cl.
*G01R 31/20* (2006.01)
(52) U.S. Cl. ......... 324/754.01; 324/754.07; 324/754.08; 324/750.3; 438/11; 438/12; 438/17; 702/118; 702/119; 702/176
(58) Field of Classification Search ............ 324/754.01, 324/754.05, 754.08, 757.03, 762.05, 750.01, 324/750.16, 73.1, 765; 702/118, 119, 176; 408/11, 12, 17; 257/48, E2.531
See application file for complete search history.

(56) References Cited

U.S. PATENT DOCUMENTS

| 7,307,433 B2 | 12/2007 | Miller et al. | |
| 7,859,287 B2 * | 12/2010 | An et al. | 324/762.02 |
| 2004/0113642 A1 * | 6/2004 | Sugimoto et al. | 324/754 |
| 2005/0237073 A1 | 10/2005 | Miller et al. | |
| 2006/0273809 A1 * | 12/2006 | Miller et al. | 324/754 |
| 2007/0165469 A1 * | 7/2007 | Rehm et al. | 365/201 |
| 2008/0100320 A1 | 5/2008 | Miller et al. | |
| 2010/0052724 A1 * | 3/2010 | Mizuno | 324/765 |

FOREIGN PATENT DOCUMENTS

| JP | 10-123204 A | 5/1998 |
| JP | 11-101847 A | 4/1999 |
| JP | 11-211793 A | 8/1999 |
| JP | 2008-116220 A | 5/2008 |
| KR | 10-2006-0005820 A | 1/2006 |
| KR | 10-2007-0006917 A | 1/2007 |
| KR | 10-0718457 B1 | 5/2007 |
| KR | 10-2009-0051888 A | 5/2009 |

* cited by examiner

*Primary Examiner* — Huy Q Phan
*Assistant Examiner* — Thang Le

(57) ABSTRACT

A testing apparatus includes a test controller configured to output a plurality of chip selection signals for selecting chips to be tested from among a plurality of chips, a plurality of first control signals for controlling supply of a power supply voltage to the chips selected by the chip selection signals, and a plurality of second control signals for controlling receiving of test voltages output from the chips supplied with the power supply voltage, and a probe card including one or more test blocks each having a plurality of signal transmitters configured to respectively transfer the power supply voltage to the corresponding chips in response to the different first control signals and respectively apply the test voltages output from the corresponding chips to the test controller in response to the different second control signals.

20 Claims, 4 Drawing Sheets

INTEGRATED CIRCUIT TESTING APPARATUS AND METHOD

PRIORITY STATEMENT

This application claims the benefit of priority under 35 U.S.C. §119 from Korean Patent Application No. 10-2009-0118566, filed in the Korean Intellectual Property Office on Dec. 2, 2009, the entire contents of which are hereby incorporated herein by reference.

BACKGROUND

1. Field

Exemplary embodiments relate to a testing apparatus and method, and more particularly, to a testing apparatus having a probe card capable of reducing a test time and a testing method using the same.

2. Description of Related Art

In general, a semiconductor manufacturing process is broadly divided into a fabrication process, which is an earlier process, and an assembly process, which is a later process. In the fabrication process, an integrated circuit (IC) pattern is formed on a wafer. In the assembly process, the wafer is divided into a plurality of chips. Conductors such as conductive leads or balls come in contact with each of the chips to exchange signals with external devices, and then the chips are molded with, for example, epoxy resin, to be assembled as an IC package.

Before the assembly process, an electrical die sorting (EDS) process for testing electrical characteristics of the respective semiconductor chips on the wafer is performed. In the EDS process, defective chips among the chips formed on the wafer are detected so that a reparable chip is repaired and an irreparable chip is removed to save the time and cost spent in subsequent processes. After the fabrication process, testing for detecting short, open, direct current (DC) and pattern failures is performed.

To determine whether semiconductor chips on a wafer are defective, a separate testing apparatus is used. The testing apparatus includes a probe card that has a plurality of needles electrically contacting pads of the respective chips on the wafer, and a control circuit that exchanges signals with the chips on the wafer through the probe card to determine whether the chips are defective. When the chips on the wafer output internal signals in response to signals of the control circuit transferred through the probe card, the control circuit receives the internal signals, determines whether the chips on the wafer are defective, and sorts the chips. In general, the testing apparatus contacts the probe card with one wafer several times to test the wafer.

SUMMARY

Exemplary embodiments provide a testing apparatus having a probe card configured to reduce a test time, and a testing method using the same.

According to one aspect, the inventive concept is directed to a testing apparatus. The testing apparatus includes: a test controller configured to output a plurality of chip selection signals for selecting chips to be tested from among a plurality of chips, a plurality of first control signals for controlling supply of a power supply voltage to the chips selected by the chip selection signals, and a plurality of second control signals for controlling receiving of test voltages output from the chips supplied with the power supply voltage; and a probe card including one or more test blocks each having a plurality of signal transmitters configured to respectively transfer the power supply voltage to the corresponding chips in response to the different first control signals and respectively apply the test voltages output from the corresponding chips to the test controller in response to the different second control signals.

In one embodiment, the test controller activates all the chip selection signals.

In one embodiment, the test controller simultaneously activates the first control signals.

In one embodiment, the test controller selectively activates the second control signals applied to the signal transmitters of the respective test blocks.

In one embodiment, the corresponding signal transmitters in the respective test blocks share signal lines through which the first control signals and the second control signals are applied.

In one embodiment, the respective test blocks transfer the test voltages to the test controller through different lines.

In one embodiment, the test controller sequentially activates the second control signals with all the first control signals activated and then deactivates the first control signals.

In one embodiment, each of the signal transmitters includes: a first sub-signal transmitter configured to transfer the power supply voltage to a corresponding chip when a corresponding chip selection signal and a corresponding first control signal are activated; and a second sub-signal transmitter configured to transfer a test voltage output from the corresponding chip to the test controller when the corresponding chip selection signal and a corresponding second control signal are activated.

According to another aspect, the inventive concept is directed to a testing method. The testing method includes: activating a plurality of chip selection signals for selecting chips to be tested; selecting chips to be tested from among a plurality of chips on the basis of the chip selection signals; activating a plurality of first control signals for controlling supply of a power supply voltage to the selected chips; simultaneously supplying the power supply voltage to the selected chips on the basis of the first control signals; selectively activating a plurality of second control signals for controlling transfer of test voltages generated from the selected chips; selectively transferring the test voltages generated from the selected chips to a test controller on the basis of the second control signals; and measuring, at the test controller, the test voltages and determining whether the corresponding chips are defective.

According to another aspect, the inventive concept is directed to a testing apparatus. The testing apparatus includes: a test controller configured to output a plurality of chip selection signals for selecting chips to be tested from among a plurality of chips, a plurality of first control signals for controlling supply of a power supply voltage to the chips selected by the chip selection signals, and a plurality of second control signals for controlling receiving of test voltages output from the chips supplied with the power supply voltage; and a probe card including one or more test blocks configured to simultaneously supply the power supply voltage to the chips selected by the chip selection signals in response to the first control signals and selectively transfer the test voltages output from the selected chips to the test controller in response to the second control signals.

In one embodiment, each of the test blocks has a plurality of signal transmitters respectively selected by different chip selection signals.

In one embodiment, the test controller activates the chip selection signals.

In one embodiment, the each of the test blocks has a plurality of signal transmitters configured to transfer the power supply voltage to corresponding chips in response to different first control signals, respectively. In one embodiment, the test controller simultaneously activates the first control signals.

In one embodiment, each of the test blocks has a plurality of signal transmitters configured to transfer test voltages output from corresponding chips to the test controller in response to different second control signals, respectively. In one embodiment, the test controller selectively activates the second control signals applied to the signal transmitters of the respective test blocks.

In one embodiment, the respective test blocks have signal transmitters configured to share signal lines through which the first control signals and the second control signals are applied.

In one embodiment, the respective test blocks transfer the test voltages to the test controller through different lines.

In one embodiment, the test controller sequentially activates the second control signals with all the first control signals activated and then deactivates the first control signals.

In one embodiment, each of the test blocks has a plurality of signal transmitters each having a first sub-signal transmitter configured to transfer the power supply voltage to a corresponding chip when a corresponding chip selection signal and a corresponding first control signal are activated, and a second sub-signal transmitter configured to transfer a test voltage output from the corresponding chip to the test controller when the corresponding chip selection signal and a corresponding second control signal are activated.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. It should be understood that various aspects of the drawings may have been exaggerated for clarity.

DETAILED DESCRIPTION OF THE EMBODIMENTS

Figure 1:
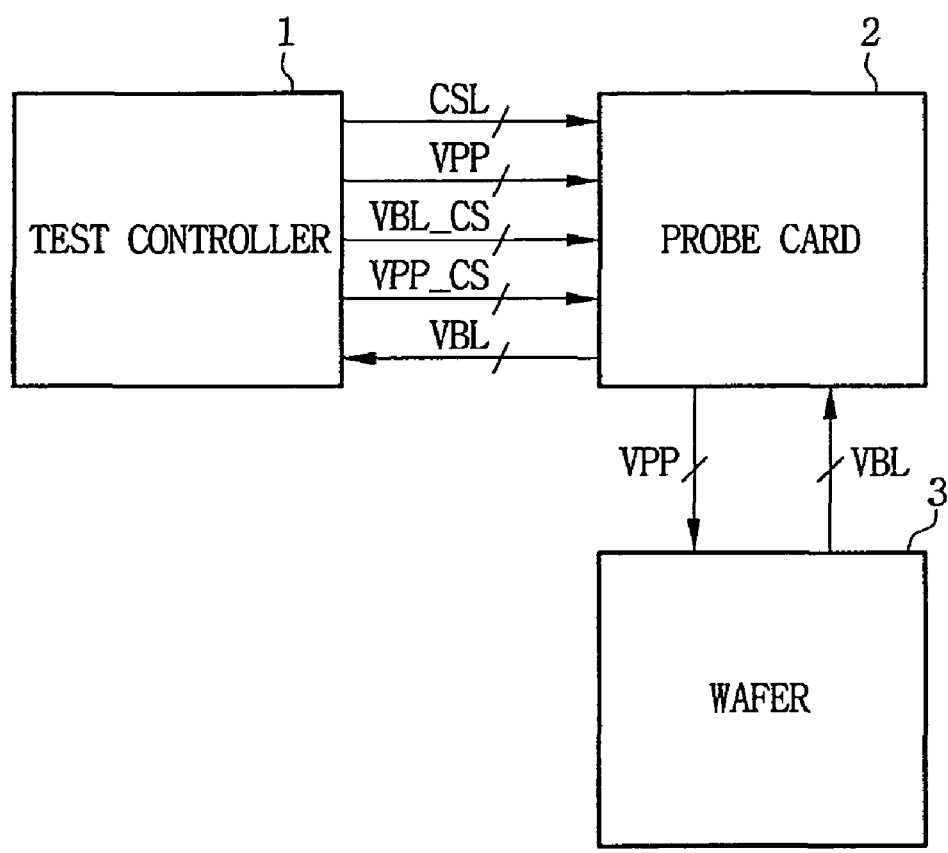
FIG. 1 is a block diagram of a testing apparatus according to exemplary embodiments.

Various exemplary embodiments will now be described more fully with reference to the accompanying drawings in which some exemplary embodiments are shown.

Detailed illustrative embodiments are described herein. However, specific structural and functional details described herein are merely representative for purposes of describing exemplary embodiments. This inventive concept, however, may be embodied in many alternate forms and should not be construed as limited to only exemplary embodiments set forth herein.

Accordingly, while exemplary embodiments are capable of various modifications and alternative forms, embodiments thereof are shown by way of example in the drawings and will herein be described in detail. It should be understood, however, that there is no intent to limit exemplary embodiments to the particular forms described, but on the contrary, exemplary embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region.

Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe exemplary embodiments, various aspects will be described in detail with reference to the attached drawings. However, the inventive concept is not limited to exemplary embodiments described.

Exemplary embodiments relate to a testing apparatus and method.

FIG. 1 is a block diagram of a testing apparatus according to exemplary embodiments.

Referring to FIG. 1, the testing apparatus includes a test controller 1 and a probe card 2. Also, a plurality of chips (not shown) are formed on a wafer 3 through a fabrication process.

Operation of the testing apparatus constituted as described above will be described below.

The test controller 1 generates a plurality of chip selection signals CSL, a plurality of power supply voltages VPP, a plurality of bit-line voltage control signals VBL_CS, and a plurality of high power supply voltage control signals VPP_CS to test the chips formed on the wafer 3. Here, the chip selection signals CSL are intended to select chips to be tested among the chips formed on the wafer 3, and the high-power supply voltage control signals VPP_CS are intended to control supply of the high power supply voltages VPP to the chips selected by the chip selection signals CSL. Also, the bit-line voltage control signals VBL_CS are intended to control the test controller 1 to receive bit-line voltages VBL output from the selected chips.

Under the control of the test controller 1, the probe card 2 functions to transfer signals between the test controller 1 and the wafer 3. To be specific, the probe card 2 selects chips to be tested from among the chips on the wafer 3 in response to the chip selection signals CSL input from the test controller 1, and supplies the high power supply voltages VPP input from the test controller 1 to the selected chips in response to the high power supply voltage control signals VPP_CS. The chips that are supplied with the high power supply voltages VPP and powered on generate bit-line voltages VBL therein and output the bit-line voltages VBL, and the probe card 2 sequentially transfers the bit-line voltages VBL generated by the respective chips to the test controller 1 in response to the bit-line voltage control signals VBL_CS. Although not shown in the drawing, a plurality of needles are formed on one surface of the probe card 2. These needles are electrically contacted with pads of the chips formed on the wafer 3 respectively, and thus the probe card 2 supplies the high power supply voltages VPP to the chips on the wafer 3 through the needles or receives the bit-line voltages VBL output from the chips through the needles.

The plurality of chips formed on the wafer 3 have pads for exchanging signals with the outside. Thus, the respective chips receive the high power supply voltages VPP through the pads electrically in contact with the needles of the probe card 2 and are powered on, and transfer the generated bit-line voltages VBP to the test controller 1.

Figure 2:
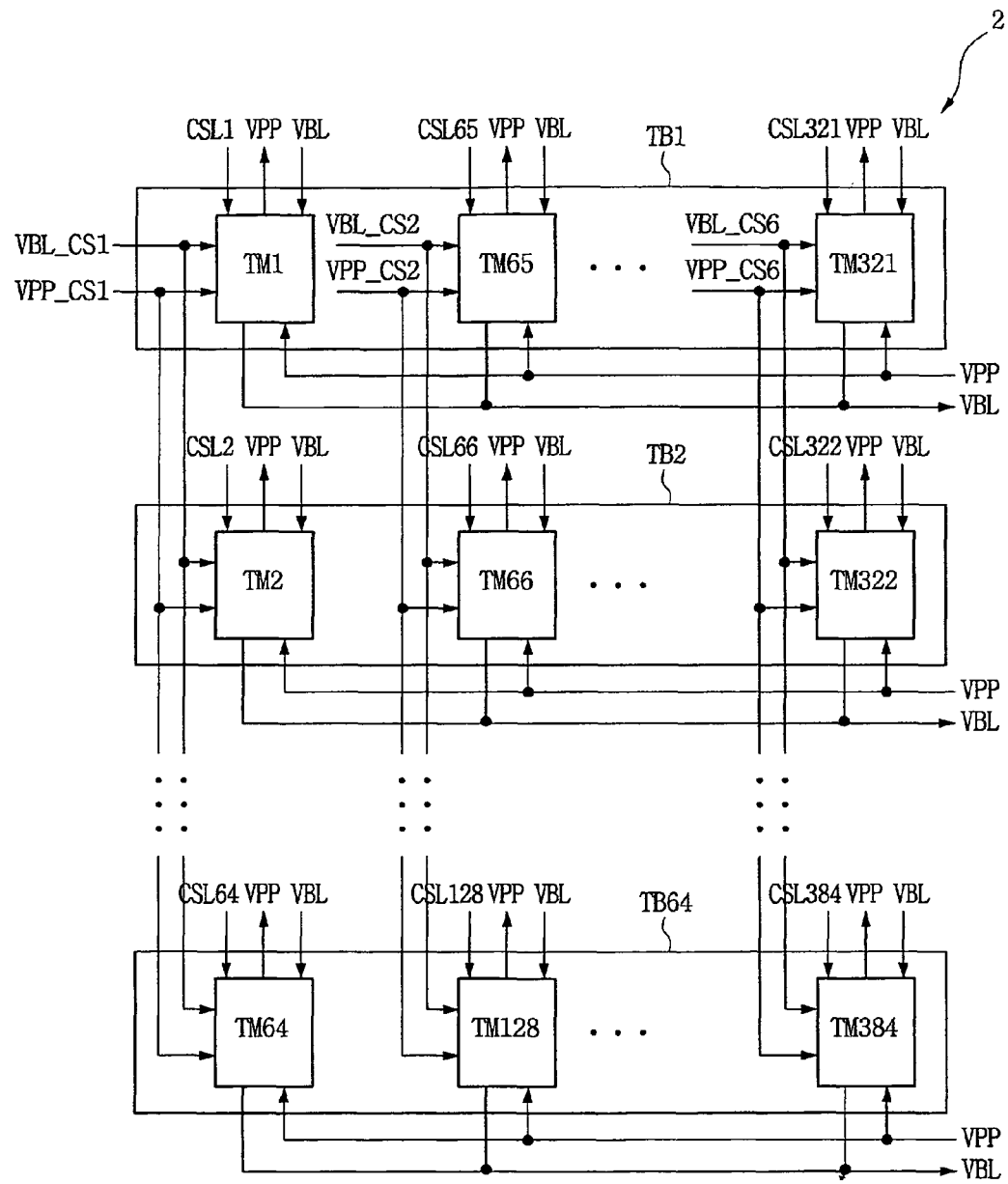
FIG. 2 is a block diagram of a probe card of FIG. 1.

FIG. 2 is a block diagram of the probe card 2 of FIG. 1.

As shown in FIG. 2, the probe card 2 according to exemplary embodiments includes a plurality of test blocks TB1 to TB64 having signal transmitters TM1 to TM384 for transferring the high power supply voltages VPP and the bit-line voltages VBL between chips to be tested and the test controller 1.

The respective test blocks TB1 to TB64 receive the high power supply voltages VPP or output the bit-line voltages VBL through different lines in response to chip selection signals CSL1 to CSL384, high power supply voltage control signals VPP_CS1 to VPP_CS6, and bit-line voltage control signals VBL_CS1 to VBL_CS6. That is, each of the test blocks TB1 to TB64 is separately controlled and operated. The respective signal transmitters TM1 to TM384 have needles (not shown) that are electrically contacted with the pads prepared on the chips of the wafer 3. That is, the signal transmitters TM1 to TM384 correspond to chips to be tested, respectively.

The corresponding signal transmitters TM1 to TM384 in the respective test blocks TB1 to TB64 share signal lines through which the high power supply voltage control signals VPP_CS1 to VPP_CS6 and the bit-line voltage control signals VBL_CS1 to VBL_CS6 are applied. For example, the first signal transmitter TM1 of the first test block TB1, the second signal transmitter TM2 of the second test block TB2, . . . , and the sixty-fourth signal transmitter TM64 of the sixty-fourth test block TB64 share the same signal lines and receive the first high power supply voltage control signal VPP_CS1 and the first bit-line voltage control signal VBL_CS1 through the signal lines. Likewise, the 321st signal transmitter TM321 of the first test block TB1, the 322nd signal transmitter TM322 of the second test block TB2, . . . , and the 384th signal transmitter TM384 of the sixty-fourth test block TB64 share the same signal lines and receive the sixth high power supply voltage control signal VPP_CS6 and the sixth bit-line voltage control signal VBL_CS6 through the signal lines.

Operation of the test blocks TB1 to TB64 according to some embodiments will be described below.

The test controller 1 activates all the chip selection signals CSL1 to CSL384 that are output to test chips in contact with all the signal transmitters TM1 to TM384 of the probe card 2. Thus, all the chips corresponding to the signal transmitters TM1 to TM384 are selected for a test.

Subsequently, the test controller 1 simultaneously activates the high power supply voltage control signals VPP_CS1 to VPP_CS6 that are applied to the respective test blocks TB1 to TB64. The test blocks TB1 to TB64 simultaneously supply the high power supply voltages VPP to all the selected chips through all the signal transmitters TM1 to TM384 respectively in response to the high power supply voltage control signals VPP_CS1 to VPP_CS6. After this, the chips supplied with the high power supply voltages VPP are powered on, generate the bit-line voltages VBL therein, and output the bit-line voltages VBL.

Subsequently, the test controller 1 sequentially activates the bit-line voltage control signals VBL_CS1 to VBL_CS6 applied to the test blocks TB1 to TB64 with all the high power supply voltage control signals VPP_CS1 to VPP_CS6 activated. Thus, the signal transmitters TM1 to TM384 of the test blocks TB1 to TB64 selectively transfer the bit-line voltages VBL applied from the selected chips to the test controller 1 in response to the bit-line voltage control signals VBL_CS1 to VBL_CS6. At this time, the corresponding signal transmitters TM1 to TM384 in the respective test blocks TB1 to TB64 are simultaneously activated in response to the applied bit-line voltages VBL_CS1 to VBL_CS6. For example, the first to sixty-fourth signal transmitters TM1 to TM64 simultaneously output bit-line voltages VBL to the test controller 1 in response to the same first bit-line voltage control signal VBL_CS1. Likewise, the 321st to the 384th signal transmitters TM321 to TM384 simultaneously output bit-line voltages VBL to the test controller 1 in response to the same sixth bit-line voltage control signal VBL_CS6.

After the probe card 2 transfers the bit-line voltages VBL output from the chips to the test controller 1 through all the signal transmitters TM1 to TM384 of the test blocks TB1 to TB64, the test controller 1 deactivates the high power supply voltage control signals VPP_CS1 to VPP_CS6 and blocks the high power supply voltages VPP supplied to the chips.

The chips on the wafer 3 are substantially supplied with the high power supply voltages VPP and generate direct current (DC) voltages, such as VBL, VREF and VBB, and DC currents, such as ICC2P and ICC6. However, for convenience, only the bit-line voltages VBLs are shown in the drawings. Thus, a plurality of signal transmitters for transferring many internal voltages or currents generated by the chips to the test controller 1 during a DC test following the fabrication process are prepared in the probe card 2. When control signals received from the test controller 1 are activated, the corresponding internal voltages or currents output from chips are transferred to the test controller 1.

In the probe card 2 of FIG. 2, each of the test blocks TB1 to TB64 has six signal transmitters according to a hexa die test (HDT) method in which each of the test blocks TB1 to TB64 tests six chips. However, this constitution is merely an example, and the constitution and operation of the exemplary embodiment illustrated in FIG. 2 can be applied to any of a dual die test (DDT) method, in which each test block has two signal transmitters and tests two chips, a quad die test (QDT) method, in which each test block tests four chips, an octal die test (ODT) method, in which each test block tests ten chips, and so on.

Figure 3:
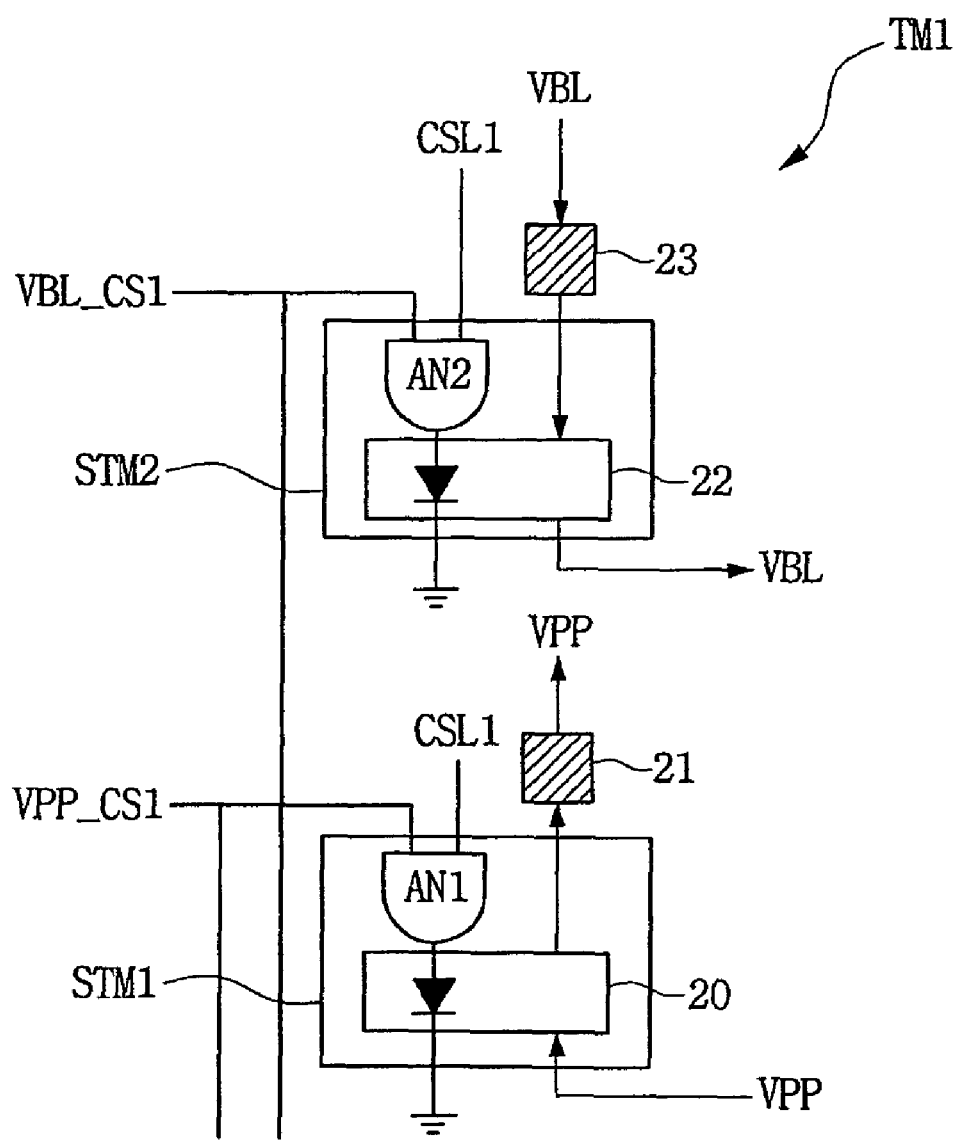
FIG. 3 is a block diagram showing the constitution of a first signal transmitter of FIG. 2.

FIG. 3 is a block diagram showing the constitution of the first signal transmitter TM1 of FIG. 2, according to some embodiments.

As illustrated in FIG. 3, the first signal transmitter TM1 according to exemplary embodiments includes a first sub-signal transmitter STM1 that transfers a high power supply voltage VPP to a chip, and a second sub-signal transmitter STM2 that transfers a bit-line voltage VBL output from the chip to the test controller 1.

The first sub-signal transmitter STM1 includes an AND gate AN1 that performs a logical conjunction on the first chip selection signal CSL1 and the first high power supply voltage control signal VPP_CS1, and a relay 20 that controls transfer of the high power supply voltage VPP between a needle 21 and the test controller 1 in response to an output signal of the AND gate AN1. When the first chip selection signal CSL1 and the first high power supply voltage control signal VPP_CS1 are both activated to a high level, the AND gate AN1 generates an output signal of the high level, and the relay 20 is turned on in response to the output signal of the AND gate AN1 and transfers the high power supply voltage VPP to the needle 21. In other words, when the first high power supply voltage control signal VPP_CS1 is activated with a chip in contact with the needle 21 selected, the first sub-signal transmitter STM1 supplies the high power supply voltage VPP applied from the test controller 1 to the chip through the needle 21.

The second sub-signal transmitter STM2 includes an AND gate AN2 that performs a logical conjunction on the first chip selection signal CSL1 and the first bit-line voltage control signal VBL_CS1, and a relay 22 that controls transfer of a bit-line voltage VBL between a needle 23 and the test controller 1 in response to an output signal of the AND gate AN2. When the first chip selection signal CSL1 and the first bit-line voltage control signal VBL_CS1 are both activated to the high level, the AND gate AN2 generates an output signal of the high level, and the relay 22 is turned on in response to the output signal of the AND gate AN2 and transfers the bit-line voltage VBL output from the chip to the test controller 1.

In this way, the first signal transmitter TM1 supplies the high power supply voltage VPP to the chip or transfers the bit-line voltage VBL output from the chip to the test controller 1 through the relays 20 and 22 prepared therein. Likewise, the second to 384th signal transmitters have the same constitution and operate in the same way as the first signal transmitter TM1, and the descriptions will not be reiterated.

Figure 4:
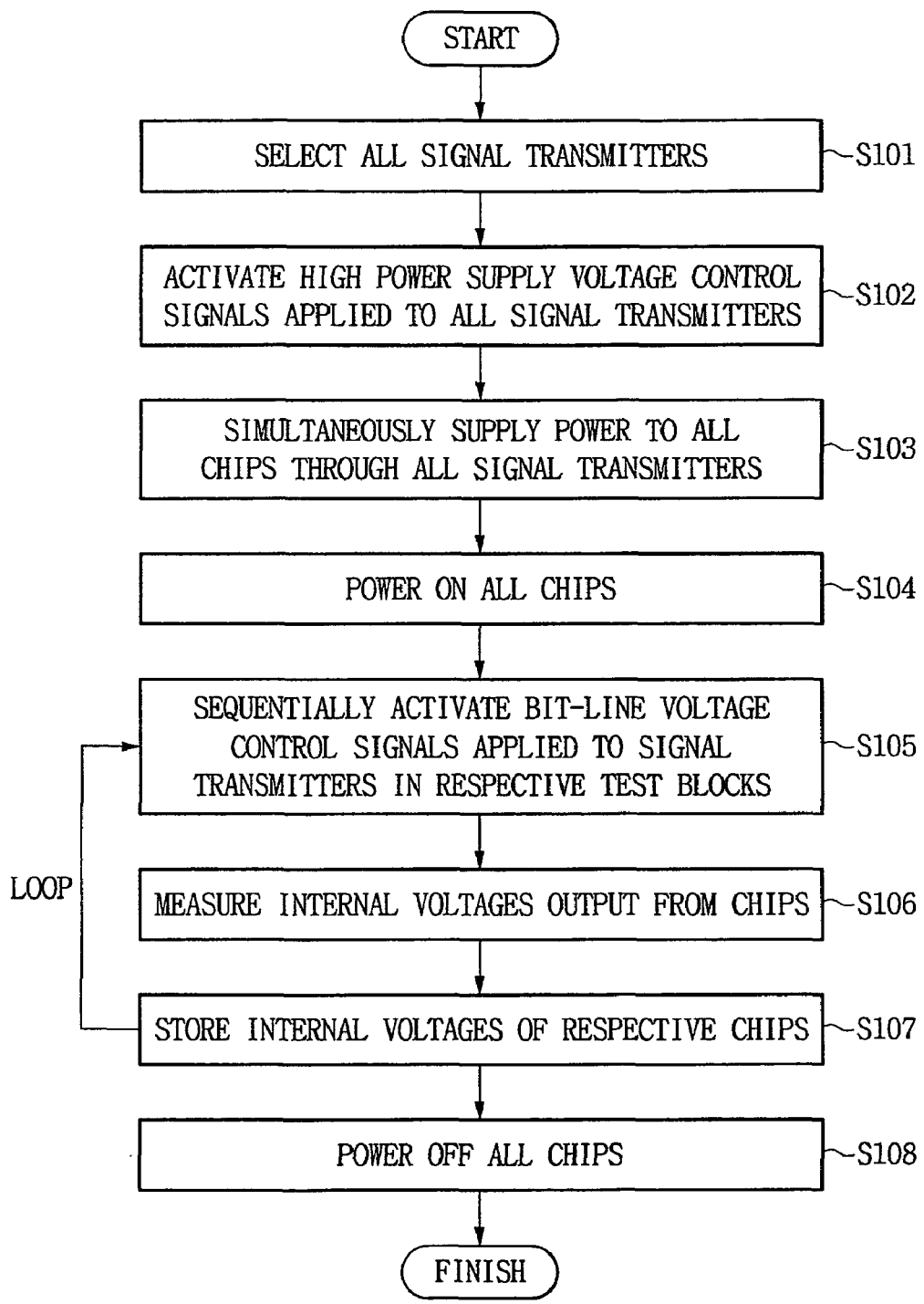
FIG. 4 is a flowchart illustrating operation of the testing apparatus of FIG. 1.

FIG. 4 is a flowchart illustrating operation of the testing apparatus of FIG. 1, according to some embodiments.

Referring to FIGS. 1 to 4, the test controller 1 activates the chip selection signals CSL1 to CSL384 to select chips to be tested. Then, the signal transmitters TM1 to TM384 corresponding to the respective chips are selected (S101). The test controller 1 simultaneously activates the high power supply voltage control signals VPP_CS1 to VPP_CS6 applied to the signal transmitters TM1 to TM384 (S102), and then the probe card 2 simultaneously supplies the high power supply voltages VPP applied from the test controller 1 to the chips to be tested through the signal transmitters TM1 to TM384 (S103). The chips supplied with the high power supply voltages VPP are powered on (S104), and generate the bit-line voltages VBL therein. To receive the bit-line voltages VBL, the test controller 1 sequentially activates the bit-line voltage control signals VBL_CS1 to VBL_CS6 applied to the test blocks TB1 to TB64 of the probe card 2 (S105). In response to the bit-line voltage control signals VBL_CS1 to VBL_CS6, the signal transmitters TM1 to TM384 of the respective test blocks TB1 to TB64 selectively transfer the bit-line voltages VBL to the test controller 1. The test controller 1 measures the bit-line voltages VBL (S106) and stores the bit-line voltages VBL (S107).

Steps 105 to 107 are repeated until the signal transmitters TM1 to TM384 of the respective test blocks TB1 to TB64 are sequentially activated and all the bit-line voltages VBL of the corresponding chips are transferred to the test controller 1 and stored. After all the bit-line voltages VBL are stored in the test controller 1, the test controller 1 deactivates the high power supply voltage control signals VPP_CS1 to VPP_CS6 and blocks supply of the high power supply voltages VPP. Thus, all the chips are powered off (S108), and the test controller 1 compares the bit-line voltages VBL received from the respective chips with a target voltage to determine whether or not the respective chips are defective.

In brief, in a probe card according to exemplary embodiments, signal transmitters of respective test blocks are controlled by different bit-line voltage control signals and different high power supply voltage control signals. Thus, it is possible to simultaneously supply power supply voltages to all chips through the signal transmitters and also to sequentially transfer bit-line voltages of the chips to a test controller through the signal transmitters. As a result, a testing apparatus having the probe card simultaneously supplies power supply voltages to all chips to be tested, and sequentially receives and measures internal voltages or currents output from the chips supplied with the power supply voltages.

As described above, a testing apparatus according to exemplary embodiments reduces the entire process time by reducing a test time due to the configuration of a probe card, thereby improving a product's productivity.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this inventive concept as defined in the claims. For example, exemplary embodiments can be applied to a measurement method for monitoring process variation in semiconductor equipment. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific embodiments described, and that modifications to the described embodiments, as well as other embodiments, are intended to be included within the scope of the appended claims.

What is claimed is:

1. A testing apparatus, comprising:
    a test controller configured to output a plurality of chip selection signals for selecting chips to be tested from among a plurality of chips, a plurality of first control signals for controlling supply of a power supply voltage to the chips selected by the chip selection signals, and a plurality of second control signals for controlling receiving of test voltages output from the chips supplied with the power supply voltage; and
    a probe card including one or more test blocks each having a plurality of signal transmitters configured to respectively transfer the power supply voltage to the corresponding chips in response to the first control signals and respectively apply the test voltages output from the corresponding chips to the test controller in response to the second control signals.

2. The testing apparatus according to claim 1, wherein the test controller activates all the chip selection signals.

3. The testing apparatus according to claim 1, wherein the test controller simultaneously activates the first control signals.

4. The testing apparatus according to claim 1, wherein the test controller selectively activates the second control signals applied to the signal transmitters of the respective test blocks.

5. The testing apparatus according to claim 1, wherein the corresponding signal transmitters in the respective test blocks share signal lines through which the first control signals and the second control signals are applied.

6. The testing apparatus according to claim 1, wherein the respective test blocks transfer the test voltages to the test controller through different lines.

7. The testing apparatus according to claim 1, wherein the test controller sequentially activates the second control signals with all the first control signals activated and then deactivates the first control signals.

8. The testing apparatus according to claim 1, wherein each of the signal transmitters includes: a first sub-signal transmitter configured to transfer the power supply voltage to a corresponding chip when a corresponding chip selection signal and a corresponding first control signal are activated; and a second sub-signal transmitter configured to transfer a test voltage output from the corresponding chip to the test controller when the corresponding chip selection signal and a corresponding second control signal are activated.

9. A testing method, comprising:
    activating a plurality of chip selection signals for selecting chips to be tested;
    selecting chips to be tested from among a plurality of chips on the basis of the chip selection signals;
    activating a plurality of first control signals for controlling supply of a power supply voltage to the selected chips;
    simultaneously supplying the power supply voltage to the selected chips on the basis of the first control signals;
    selectively activating a plurality of second control signals for controlling transfer of test voltages generated from the selected chips;
    selectively transferring the test voltages generated from the selected chips to a test controller on the basis of the second control signals; and
    measuring, at the test controller, the test voltages and determining whether the corresponding chips are defective.

10. A testing apparatus, comprising:
    a test controller configured to output a plurality of chip selection signals for selecting chips to be tested from among a plurality of chips, a plurality of first control signals for controlling supply of a power supply voltage to the chips selected by the chip selection signals, and a plurality of second control signals for controlling receiving of test voltages output from the chips supplied with the power supply voltage; and
    a probe card including one or more test blocks configured to simultaneously supply the power supply voltage to the chips selected by the chip selection signals in response to the first control signals and selectively transfer the test voltages output from the selected chips to the test controller in response to the second control signals.

11. The testing apparatus according to claim 10, wherein each of the test blocks has a plurality of signal transmitters respectively selected by different chip selection signals.

12. The testing apparatus according to claim 10, wherein the test controller activates the chip selection signals.

13. The testing apparatus according to claim 10, wherein the each of the test blocks has a plurality of signal transmitters configured to transfer the power supply voltage to corresponding chips in response to respective first control signals.

14. The testing apparatus according to claim 13, wherein the test controller simultaneously activates the first control signals.

15. The testing apparatus according to claim 10, wherein each of the test blocks has a plurality of signal transmitters configured to transfer test voltages output from corresponding chips to the test controller in response to respective second control signals.

16. The testing apparatus according to claim 15, wherein the test controller selectively activates the second control signals applied to the signal transmitters of the respective test blocks.

17. The testing apparatus according to claim 10, wherein the respective test blocks have signal transmitters configured to share signal lines through which the first control signals and the second control signals are applied.

18. The testing apparatus according to claim 10, wherein the respective test blocks transfer the test voltages to the test controller through different lines.

19. The testing apparatus according to claim 10, wherein the test controller sequentially activates the second control signals with all the first control signals activated and then deactivates the first control signals.

20. The testing apparatus according to claim 10, wherein each of the test blocks has a plurality of signal transmitters each having a first sub-signal transmitter configured to transfer the power supply voltage to a corresponding chip when a corresponding chip selection signal and a corresponding first control signal are activated, and a second sub-signal transmitter configured to transfer a test voltage output from the corresponding chip to the test controller when the corresponding chip selection signal and a corresponding second control signal are activated.

* * * * *